United States Patent [19]

Anderson et al.

[11] Patent Number: 4,795,692

[45] Date of Patent: Jan. 3, 1989

[54] NEGATIVE-WORKING POLYMERS USEFUL AS X-RAY OR E-BEAM RESISTS

[75] Inventors: Charles C. Anderson; Kristine M. Kolterman, both of Rochester; Sam R. Turner, Pittsford, all of N.Y.

[73] Assignee: Eastman Kodak Company, Rochester, N.Y.

[21] Appl. No.: 10,103

[22] Filed: Feb. 2, 1987

[51] Int. Cl.$^4$ .................... G03C 5/00; G03C 1/68; C08F 22/40
[52] U.S. Cl. ............................ 430/283; 430/287; 430/966; 430/967; 526/240; 526/262; 526/293; 526/296
[58] Field of Search .............. 430/283, 287, 966, 967, 430/296; 526/240, 262, 293

[56] References Cited

U.S. PATENT DOCUMENTS

| | | | |
|---|---|---|---|
| 2,650,215 | 8/1953 | Strain | 526/262 |
| 3,857,822 | 12/1974 | Frass | 430/287 X |
| 4,158,731 | 6/1979 | Baumann et al. | 430/283 X |
| 4,289,842 | 9/1981 | Tan et al. | 430/270 |
| 4,532,332 | 7/1985 | Müller | 526/262 X |
| 4,568,734 | 2/1986 | Tan et al. | 526/266 |

OTHER PUBLICATIONS

Chemical Abstracts, 4188j, vol. 76, 1972, p. 2.

*Primary Examiner*—Paul R. Michl
*Assistant Examiner*—Cynthia Hamilton
*Attorney, Agent, or Firm*—William J. Davis

[57] ABSTRACT

Radiation-sensitive interpolymers comprising 10–90 mole % of a polymerized maleimide monomer are useful as resists having high sensitivity to E-beams or X-rays.

9 Claims, No Drawings

NEGATIVE-WORKING POLYMERS USEFUL AS X-RAY OR E-BEAM RESISTS

FIELD OF THE INVENTION

This invention relates to negative-working polymers suitable for exposure to X-rays or electron beams to form a resist image. Such resists are particularly useful in the manufacture of semiconductor devices.

BACKGROUND OF THE INVENTION

Based on current trends, it is expected that minimum feature sizes in microelectronic devices will approach 0.5 μm by the early 1990's. At present, it appears that photolithography, using near to mid UV radiation is limited to replication of structures with dimensions of about 0.6 μm. E-beam and X-ray sensitive resists are at the forefront of the manufacture of integrated circuits because they permit the formation of smaller images than do resists which are responsive only to light radiation. The procedure is to expose the resists applied to suitable substrates to an electron beam or X-rays to generate features having submicron dimensions. After the resist is developed, the substrate not protected by the resist is etched, usually by a chemical or plasma etching.

One of the difficulties with such a procedure is the scarcity of useful negative-working resists. Not only must the resist demonstrate sensitivity to an X-ray or E-beam, but it must also resist deformation and dissolution by the etching process applied to the substrate or base material, usually a semiconductor. Thus, only a few resists have been found to be useful in providing features of submicron dimensions with strict tolerances. For example, superior E-beam and X-ray sensitive resists are described in U.S. Pat. Nos. 4,289,842 and 4,568,734. The '842 patent describes novel acrylate copolymer materials with enhanced sensitivity and plasma etch resistance. The '734 patent describes a resist comprising copolymers of either allyl or propargyl methacrylate and an acrylate or methacrylate bearing an oxygen-containing heterocyclic ring. Although such resists have been particularly useful, there is a need for radiation-sensitive resists which are compatible with present and future X-ray sources, target materials, imaging techniques and which stand up to high energy image transfer processes such as plasma etching.

Therefore, what has been desired is a negative-working resist material having excellent sensitivity, good plasma etch resistance, submicron resolution capability, and which is adaptable to a variety of imaging techniques.

SUMMARY OF THE INVENTION

In accordance with the present invention there is provided a negative-working resist having excellent sensitivity and good etch resistance that is capable of providing submicron resolution. Further, the resist material is adaptable to a variety of E-beam and X-ray imaging techniques.

The features of the invention are achieved, more specifically, by providing a radiation-sensitive interpolymer comprising 10–90 mole % of a polymerized maleimide monomer and 90–10 mole % of one or more polymerizable monomers polymerized therewith, such maleimide monomer having the structural formula:

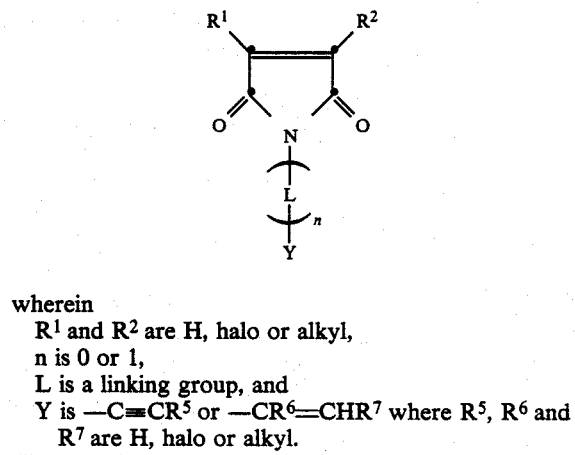

wherein
$R^1$ and $R^2$ are H, halo or alkyl,
n is 0 or 1,
L is a linking group, and
Y is $-C\equiv CR^5$ or $-CR^6=CHR^7$ where $R^5$, $R^6$ and $R^7$ are H, halo or alkyl.

The negative-working photoresist element of this invention comprises the above-noted radiation-sensitive polymer and a substrate.

In another aspect of the invention, a method of imagewise hardening on a substrate, a layer of a resist comprising the polymer described above, comprises the steps of (a) imagewise exposing the layer to X-ray or electron beam radiation; and (b) developing the layer by washing it with a solvent for the unexposed polymer.

DESCRIPTION OF THE PREFERRED EMBODIMENTS

The interpolymers of the invention are hereinafter described primarily as E-beam and X-ray resists. These polymers are also useful as resists exposed to other forms of radiation.

The interpolymers of a maleimide monomer useful herein include copolymers of such maleimide monomer. Furthermore, it is contemplated that one or more additional polymerizable monomers can be incorporated into the interpolymer if desired. The term interpolymer is intended to include all such polymers. As noted, a particularly advantageous feature of the invention is that the described maleimide monomers can be polymerized with a variety of polymerizable monomers to provide radiation-sensitive resist materials adaptable to a variety of imaging techniques.

The interpolymer of the invention comprises 10–90% mole of a polymerized maleimide monomer preferably having the formula set forth in the Summary above, wherein $R^1$ and $R^2$ are independently H; halo, such as fluoro, chloro, bromo, or iodo; alkyl, preferably containing from 1 to 3 carbon atoms such as methyl, ethyl or propyl; L is one or more linking groups preferably selected from alkylene, preferably containing from 1 to 3 carbon atoms such as methylene, ethylene or propylene; arylene such as phenylene; or arylenealkylene such as phenylenemethylene; and Y is selected from the group consisting of $-C\equiv CR^5$ and $-CR^6=CHR^7$ where $R^5$, $R^6$ and $R^7$ are independently H, halo, such as fluoro, chloro, bromo or iodo; or alkyl, preferably containing from 1 to 3 carbon atoms such as methyl, ethyl and propyl. Polymers having greater than about 90 mole % of the maleimide monomer are too highly reactive and crosslinkable to be conveniently prepared.

The interpolymer of the invention comprises 90–10 mole % of one or more polymerizable monomers polymerized with the above-described maleimide monomer. Any monomer can be included to form recurring units in the polymer of the invention, provided that it is compatible—that is, that it does not interfere with the crosslinking of the polymer. Preferred are electron rich monomers which can be conveniently polymerized with the electron poor maleimide monomer.

A preferred class of polymerizable monomers is derived from styrene and has the structural formula:

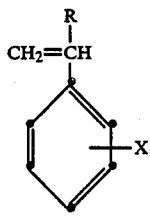

wherein R is H or methyl. X in the above formula can be Br, Cl, I, Si(CH$_3$)$_3$, Sn(CH$_3$)$_3$, CH$_2$Br, CH$_2$Cl, CH$_2$I, CH$_2$ Si(CH$_3$)$_3$, CH$_2$Sn (CH$_3$)$_3$ or OH. As is known in the art, the X substituent on the aromatic ring can be selected to provide high X-ray absorption at specific X-ray emissions, and an additional crosslinking site. The aromatic groups provide resistance to oxygen or fluorocarbon plasma or reactive ion etching.

Another preferred class of copolymerizable monomers is the vinyl ethers. Useful examples of such monomers include ethyl vinyl ether, chloroethyl vinyl ether, n-butyl vinyl ether, and phenyl vinyl ether. Another preferred class of comonomers is the acrylates, such as 2-chloroethyl acrylate. Furthermore, it is contemplated that the maleimide monomer described herein can be copolymerized with ethylene, vinyl acetate, divinyl ethers, stilbenes and substituted stilbenes such as dichlorostilbene, N-vinyl carbazoles, 1,3-dienes such as isoprene and butadiene, and vinyl pyridines such as 2-vinyl pyridine and 4-vinyl pyridine, to yield polymers useful as resists having high sensitivity to E-beams or X-rays.

Specific illustrative polymers of this invention which have been prepared include the following:
(a) poly(N-allyl maleimide-co-vinylbenzyl chloride),
(b) poly(N-allyl maleimide-co-vinylbenzyl bromide),
(c) poly(N-allyl maleimide-co-vinylbenzyl iodide),
(d) poly(N-allyl maleimide-co-4-chlorostyrene)
(e) poly(N-allyl maleimide-co-4-bromostyrene),
(f) poly(N-allyl maleimide-co-styrene),
(g) poly(N-allyl maleimide-co-vinylbenzyl trimethyl stannane),
(h) poly(N-allyl maleimide-co-vinylbenzyl trimethyl silane),
(i) poly(N-allyl maleimide-co-pentabromostyrene),
(j) poly(N-allyl maleimide-co-3,5-dibromostyrene),
(k) poly(N-allyl maleimide-co-vinylbenzyl dimethyl allyl silane)
(l) poly(N-allyl maleimide-co-ethylvinyl ether)
(m) poly(N-allyl maleimide-co-chloroethylvinyl ether)
(n) poly(N-phenyl acetylene maleimide-co-vinylbenzyl chloride),
(o) poly(N-phenyl 1,2-dibromoallyl maleimide-co-vinylbenzyl chloride), The molecular weights of the polymers of the invention can vary widely, provided that the polymer has a low enough viscosity in the solvent of choice to permit it to be coated. It has been found that useful viscosities are generally 0.3 inherent viscosity or less, as measured in N,N-dimethyl formamide at 25° C. However, very low molecular weights tend to reduce the sensitivity undesirably. Preferably, therefore, the styrene equivalent number average molecular weight of the polymer, as determined by gel permeation chromatography analysis, is between about 10,000 and 100,000. Most preferably it is between about 20,000 and 60,000.

The polymers of the invention can be conveniently prepared by conventional donor-acceptor free radical-initiated solution polymerization. It should be noted, however, that dilute reaction conditions are preferred to avoid undesirable crosslinking. The preparations set forth hereafter in the Examples are illustrative.

The polymer of this invention preferably has a glass transition temperature greater than about 150° C. Such polymers exhibit enhanced dimensional integrity and stability during high energy image transfer processes such as plasma etching. It is believed that the effectiveness of these polymers as negative-working resists is based partly on the presence of the unsaturated N-substituted group of the maleimide monomer which provides a highly reactive crosslinking site. Preferred for use herein are predominantly alternating copolymers having a high molecular weight and concentration of crosslinking groups. Such polymers exhibit excellent compositional homogeneity.

Conventional coating procedures are useful to apply the polymer to the substrate. Preferred are whirler or spin coating, brushing, doctor-blade coating, or hopper coating. Further details of such conventional procedures are described in *Product Licensing Index*, Vol. 92, December 1971, Publication No. 9232, at p. 109.

The drying step is conveniently accomplished by baking in an oven, optionally in a vacuum, for example at 100° C. for 60 minutes.

Optionally, a post-bake step is included after exposure and development to enhance adhesion of the final resist coating to the areas to be protected, prior to etching. Such treatment is conventional.

Etching of the underlying substrate is achieved by using a chemical solvent for the substrate, or by a plasma gas, both of which are conventional. Etch resistance is measured herein as the rate at which the resist is removed by the etchant, in μm per minute.

As a resist, the polymer of the invention is preferably coated onto the substrate that is to be etched. The resist is then dried, imagewise exposed, and developed to remove the unexposed portions. Any suitable substrate is useful. Particularly preferred examples include semiconductors such as silicon wafers, chrome-clad glass, and metals such as aluminum.

Conventional solvents are useful for both the coating step and the development step. Preferred examples of solvents useful for either process step include 2-methoxyethyl acetete, 2-ethoxyethyl acetate, 2-ethoxyethanol, cyclohexanone, cyclopentanone, 4-butyrolactone, tetrahydrofuran, 2-butanone and mixtures of these with 2-propanol or ethanol.

EXAMPLES

The following examples are included for a further illustration of the invention.

Polymer Preparation

The following is illustrative of the general procedure used to prepare polymers of this invention: 5.0 g total monomers (at various molar ratios) and 0.02 g 2,2'-Azobis(2-methylpropionitrile) were mixed in 20 mL solvent. More dilute solutions were employed in some cases to prevent gel formation. Dodecanethiol, a chain transfer agent, was used to control molecular weight in some preparations. Table I gives a description of the polymers prepared in accordance with the above procedure which were used in the examples which follow.

TABLE I

| Polymer | Yield | Mole % Maleimide In Polymer | Mn |
|---|---|---|---|
| (a) | 84 | 51.3 | 35,500 |
| (e) | 85 | 51.7 | 48,300 |
| (g) | 43 | 61 | 29,200 |

The preparation of the maleimide monomer is as follows:

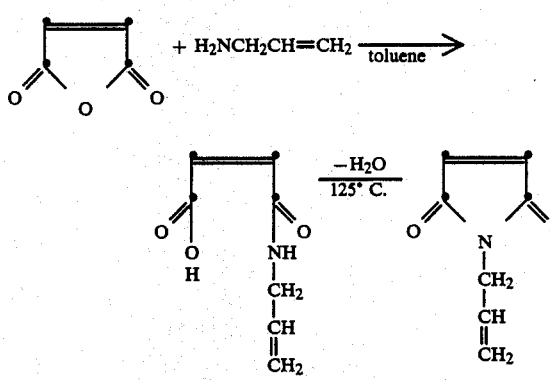

To a mixture of 132 g (1.346 mole) recrystallized maleic anhydride and 500 mL toluene, 84.4 g (1.481 mole—10% excess) allylamine diluted with 100 mL toluene was added dropwise. The mixture was stirred at room temperature for two hours and then heated for 45 minutes using a 50° C. bath. The solution was filtered to obtain a 99% yield of pale yellow crystals. Recrystallization from methanol-water gave 71% yield of white crystals with m.p.=110°-111° C. These allylmaleamic acid crystals were melted and maintained at 125° C. for 30 minutes. This red-brown liquid was distilled under reduced pressure to obtain a colorless liquid which crystallized in the receiving flask. Yield=24%. Other maleimide monomers are prepared similarly except that allylamine is replaced with the appropriate amine.

EXAMPLE 1

Negative X-Ray Resist

A negative resist formulation of 4.4 g poly(N-allyl maleimide-co-vinylbenzyl chloride) in 20.6 g 2-methoxy ethylacetate was spin-coated onto 2-inch diameter silicon wafers at 2500 RPM for 30 sec. A thickness of 1.0 μm was obtained after drying at 100° C. for 1 hour. The film was exposed to measured doses of a monochromatic X-ray beam. The resist was then developed in tetrahydrofuran for 45 sec. and rinsed in methylisobutyl ketone. When exposed to 1.5 KeV X-rays the resist gave 100% thickness remaining (0% thickness loss) at a dose of only 10 mJ/cm$^2$. A dose of only 1.0 mJ/cm$^2$ was required to give 50% thickness remaining. This resist formulation was also evaluated as an electron-beam resist. After spin-coating in the above-described manner, the resist was exposed to measured doses of 10 KeV electrons and then developed in tetrahydrofuran for 45 sec. Excellent results were obtained.

EXAMPLE 2

X-ray and E-beam Negative Resist

A negative resist formulation of 4.4 g poly(N-allyl maleimide-co-4-bromostyrene) in 20.6 g of 2-methoxy ethyl acetate was spin-coated onto 2-inch diameter silicon wafers at 2000 RPM for 30 sec. A thickness of 1.0 μm was obtained after drying at 100° C. for 1 hour. The film was exposed to measured doses of a monochromatic X-ray beam and then developed in a solution of 1 part 2-propanol to 2 parts 2-methoxyethyl acetate for 60 sec. followed by a rinse in 2-propanol. For a 1.5 KeV X-ray exposure, 100% exposed thickness remaining was obtained at a dose of only 9 mJ/cm$^2$. This resist formulation was also exposed to an electron beam. After spin-coating the resist formulation and developing the exposed film in the manner already described, excellent results were obtained.

EXAMPLE 3

Demonstration of Improved Etch Resistance

A negative resist formulation of 4 g poly(N-allyl maleimide-co-vinyl benzyl trimethyl stannane), P(MI-VBSn), in 16 g 2-methoxyethyl acetate was spin coated onto 2-inch diameter silicon wafers at 2000 RPM for 30 sec. A 1 hr, 100° C. bake gave 0.75 μm thick films. The films were then exposed to an oxygen plasma and a 96% CF$_4$/4% O$_2$ plasma in a reactive ion etcher (RIE). The etching conditions and the etch rates for the above resist formulation and for novolac resin (a conventional photoresist polymer) are given in Table II. The etch rates were measured "in situ" during etching by laser interferometry.

TABLE II

| Sample | O$_2$ RIE Etch Rate, μm/min | CF$_4$/O$_2$ RIE Etch Rate, μm/min |
|---|---|---|
| P(MI-VBSn) | 0.050 | 0.040 |
| Novolac | 0.115 | 0.081 |

RIE conditions: Power = 0.45 W/cm$^2$, Pressure = 50 mTorr

The invention has been described in detail with particular reference to preferred embodiments thereof, but it will be understood that variations and modifications can be effected within the spirit and scope of the invention.

What is claimed is:

1. An alternating copolymer having a number average molecular weight between 10,000 and 100,000 which is sensitive to X-ray radiation and capable of being coated and developed to form a negative-working resist, said polymer having therein recurring units having the structural formula:

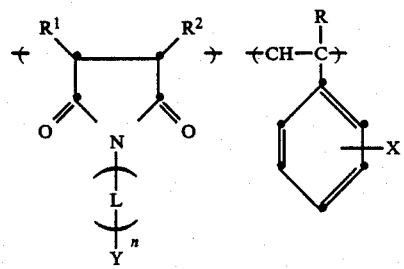

wherein:
R is H or methyl,

R[1] and R[2] are independently H, halo or alkyl;
L is a linking group;
n is 0 or 1;
X is selected from the group consisting of Br I, Si(CH$_3$)$_3$, Sn(CH$_3$)$_3$, CH$_2$Br, CH$_2$Cl, CH$_2$I, CH$_2$Si(CH$_3$)$_3$, CH$_2$Sn(CH$_3$)$_3$ and OH, and
Y is selected from the group consisting of —C≡CR[5] and —CR[6]=CHR[7] where R[5], R[6] and R[7] are independently H, halo or alkyl.

2. A negative-working photoresist element comprising a substrate and having thereon a coating of an X-ray radiation sensitive alternating copolymer having a number average molecular weight between 10,000 and 100,000, said polymer having therein recurring units having the structural formula:

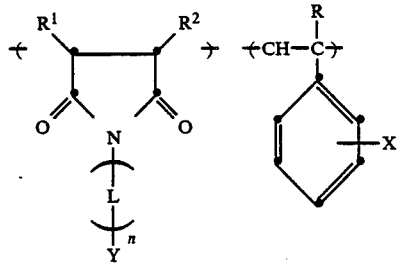

wherein:
R is H or methyl,
R[1] and R[2] are independently H, halo or alkyl;
L is a linking group;
n is 0 or 1;
X is selected from the group consisting of Br I, Si(CH$_3$)$_3$, Sn(CH$_3$)$_3$, CH$_2$Br, CH$_2$Cl, CH$_2$I, CH$_2$Si(CH$_3$)$_3$, CH$_2$Sn(CH$_3$)$_3$ and OH, and Y is selected from the group consisting of —C≡CR[5] and —CR[6]=CHR[7] where R[5], R[6] and R[7] are independently H, halo or alkyl.

3. An alternating copolymer having a number average molecular weight between 10,000 and 100,000 which is sensitive to X-ray radiation and capable of being coated and developed to form a negative-working resist, said polymer having therein recurring units having the structural formula:

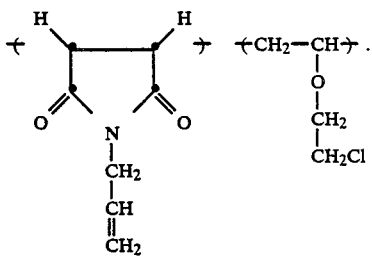

4. The polymer of claim 1 wherein L is alkylene, arylene or arylenealkylene.

5. The polymer of claim 4 wherein L is methylene or phenylene.

6. The polymer of claim 1 wherein Y is selected from the group consisting of —CH=CH$_2$, —C≡CH, and —CBr=CHBr.

7. The element of claim 2 wherein L is alkylene, arylene or arylenealkylene.

8. The element of claim 2 wherein L is methylene or phenylene.

9. The element of claim 2 wherein Y is selected from the group consisting of —CH=CH$_2$, —C≡CH, and —CBr=CHBr.

* * * * *